United States Patent [19]
Drab et al.

[11] Patent Number: 5,487,030
[45] Date of Patent: Jan. 23, 1996

[54] FERROELECTRIC INTERRUPTIBLE READ MEMORY

[75] Inventors: John J. Drab, Encitas; O. Glenn Ramer, Los Angeles, both of Calif.

[73] Assignee: Hughes Aircraft Company, Los Angeles, Calif.

[21] Appl. No.: 296,836

[22] Filed: Aug. 26, 1994

[51] Int. Cl.⁶ .................................................. G11C 11/22
[52] U.S. Cl. ........................................... 365/145; 365/149
[58] Field of Search ................................ 365/149, 145, 365/210; 257/295

[56] References Cited

U.S. PATENT DOCUMENTS

| | | | |
|---|---|---|---|
| 4,974,204 | 11/1990 | Miller | 365/145 |
| 5,218,566 | 6/1993 | Papaliolios | 365/145 |
| 5,270,967 | 12/1993 | Moazzami et al. | 365/145 |

*Primary Examiner*—Joseph A. Popek
*Attorney, Agent, or Firm*—Wanda K. Denson-Low; Georgann S. Grunebach

[57] ABSTRACT

A memory includes a first ferroelectric capacitor and a second ferroelectric capacitor electrically connected in a parallel arrangement, and writing circuitry that writes controllably different polarization states into the two ferroelectric capacitors using a single input signal. Read circuitry senses the difference in stored polarizations in the first ferroelectric capacitor and the second ferroelectric capacitor. This sensing circuit causes only a partial switching of the polarization state of the first ferroelectric capacitor and does not disturb the polarization state of the second ferroelectric capacitor. There is a restoration circuit to restore the original ferroelectric polarization of the ferroelectric capacitors following reading.

8 Claims, 2 Drawing Sheets

$(Vu-Vs)=(Ps-Pu)/Cs$ $(Vu-Vs)=(Ps-Pu)/Cs$

FERROELECTRIC INTERRUPTIBLE READ MEMORY

BACKGROUND OF THE INVENTION

This invention relates to a random access memory, and, more particularly, to such a memory that can be interrupted during readout without loss of the stored information.

Many military and some civilian systems require data storage capability in a random access memory that is nonvolatile and resistant to data loss due to disruptive events. A nonvolatile memory retains the stored data even when power is turned off for a period of time. Such nonvolatile memories are often based on physical changes that occur in a memory element when data is stored, which physical changes are not reversed or randomized upon the loss of power.

Ferroelectric materials have been successfully developed for use in nonvolatile memories. A ferroelectric material is one whose physical state changes upon the application of an electrical field, in a manner analogous with the change undergone by ferromagnetic materials to which a magnetic field is applied. The ferroelectric material has the advantages that its physical state can be controlled by the application of a voltage rather than a magnetic field, a measurable physical state is retained after a power loss, and small-size memory elements can be constructed by microelectronics fabrication techniques, which result in memory elements which consume little power.

Random access memories can be classified as destructive readout (DRO) and nondestructive readout (NDRO). In the destructive readout memory, the physical state of the memory unit is altered upon readout such that the stored data value is lost to the memory unless further action is taken. To avoid this loss of information, the stored value must be refreshed after each readout, so that the stored data are available for a subsequent readout. In the absence of refreshing of the data, it is possible to read the data only once.

In many applications, it may be assumed that refreshing can reliably occur as a regular part of a readout/refresh cycle. Destructive readout memories may therefore be employed in such situations. In other applications, however, that assumption cannot be made because there may be a disruption experienced by the system in the brief period of time between the moment when the readout is accomplished and the moment when refresh would normally occur. Such disruptions can result due to, for example, power interruptions to civilian systems and nuclear events which may be experienced by military systems.

To date, ferroelectric destructive readout memories have been developed and applied. While useful for some applications, such memories are of limited value where the system must be resistant to the effects of disruptive events. A nondestructive readout (NDRO) ferroelectric memory would have application in situations where the memory state must be retained through extended power outages must also be stable through brief, multiple disruptions that may occur when the content of the memory is being read. Several nondestructive readout memory approaches have been proposed. However, none are based on or require the partial switching of the polarization.

SUMMARY OF THE INVENTION

The present invention provides a ferroelectric-based memory that is nonvolatile. Additionally, the memory utilizes a nondestructive readout and is stable against data loss through repeated disruptions. The memory provides strong, usable readout signals even after multiple disruptions without rewriting. The memory utilizes little power and is compact. It may be fabricated using microelectronic fabrication techniques, so that large memory arrays can be prepared. The memory may be provided in a form that is also hardened and stable against radiation damage.

In accordance with the invention, a memory comprises a pair of ferroelectric capacitors in a parallel arrangement. The memory has means for writing two different polarization states into the two ferroelectric capacitors using a single input signal, where the two different states represent a binary 1 and a binary 0. The memory also includes means for sensing the difference in stored polarization of the two ferroelectric capacitors, wherein the means for sensing causes only a partial switching in the polarization state of the ferroelectric capacitors.

The use of a ferroelectric capacitor as the basic data storage element renders the memory nonvolatile. The ferroelectric state changes its direction only under the application of an input field of opposite direction to the writing field, so that the stored information is not lost in a power outage. When the means for sensing operates to read the difference in the polarization of the two ferroelectric capacitors, only a portion of the stored polarization is switched from the fully polarized ferroelectric capacitor to an intermediate stable state. If the read cycle is interrupted before the polarization is restored to the fully saturated state the data is not lost but remains stored in the remaining stable polarization. Under normal operation this NDRO memory senses a reduction in the stored polarization of one capacitor, rejuvenates the stored polarization with a completed read, and withstands several interrupted reads without loss of data. When the means for sensing operates to read the difference in the polarization of the two ferroelectric capacitors in the analogous destructive read memory, both capacitors are left with equal saturated polarizations before the data is rewritten. Under normal operation this DRO memory senses a total reversal in the stored polarization of one capacitor and rewrites the stored polarization with a completed read, but withstands no interrupted reads without loss of data.

By carefully selecting the circuit components of the NDRO memory, the memory element can be read multiple times without refreshing the ferroelectric capacitors. This multiple read capability means that the stored data can be read multiple times even though there are disruptive events occurring essentially simultaneously with each read, preventing the refresh from taking place.

For a given applied driving voltage, the capacitance of the ferroelectric capacitors is dependent upon the existing polarization state. If the driving voltage polarity produces a field along the direction of a fully saturated polarization the effective capacitance is a minimum. For any other state of polarization the effective capacitance of the ferroelectric capacitor is greater than the minimum value.

In a preferred embodiment, the memory is implemented by including each ferroelectric capacitor in a series connection with a linear capacitor for writing to and reading from the ferroelectric capacitor, in a Sawyer-Tower circuit. The ferroelectric capacitor and the linear capacitor capacitances and the applied driving voltage are selected such that (1) the product of the driving voltage and the linear capacitor capacitance is less than the switchable ferroelectric polarization, and (2) the maximum voltage across the ferroelectric capacitor at about the minimum capacitance state just saturates the polarization. For the ferroelectric material Y1, the maximum voltage is about 2½ to 3 times the coercive voltage of the ferroelectric capacitor. For a ferroelectric capacitor with a fully saturated polarization opposite to the field produced by the driving voltage, the minimum number of driving voltage applications or pulses before the polarization is completely saturated in the opposite direction is greater than the switchable polarization divided by the product of the sense capacitance and the drive voltage.

The present invention provides an advance in the art of random access memories. The memory of the invention is nonvolatile and utilizes a nondestructive readout such that is resistant to disruptions occurring when the stored data is being read.

DETAILED DESCRIPTION OF THE INVENTION

Figure 1:
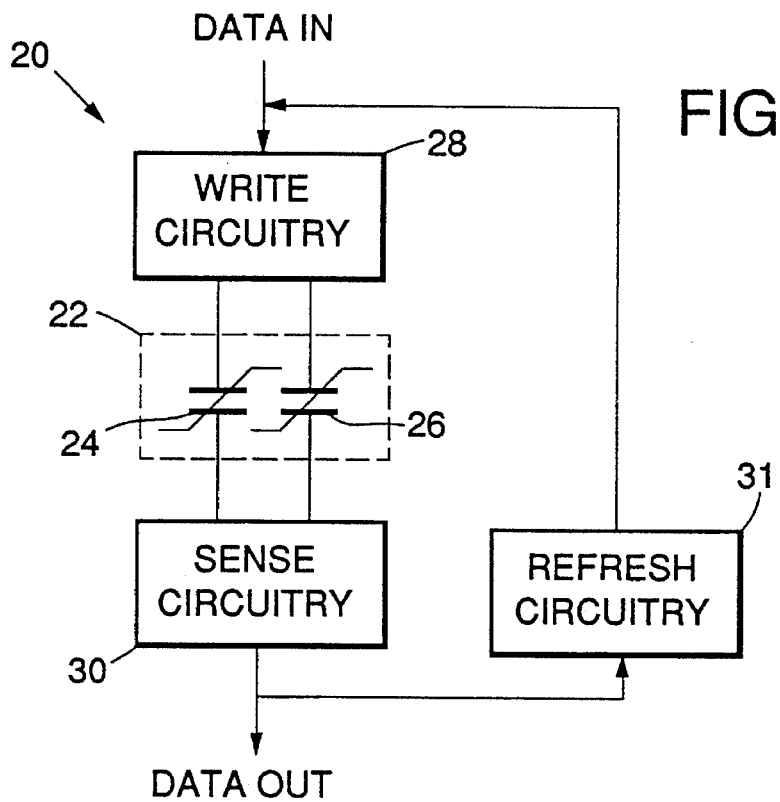
FIG. 1 is a schematic diagram of a memory unit according to the present invention.

FIG. 1 depicts in schematic form a memory unit 20 according to the present invention, for storing a single bit of information. A memory cell 22 includes a first ferroelectric capacitor 24 and a second ferroelectric capacitor 26. The ferroelectric capacitors 24 and 26 are electrically connected in parallel to a write circuit 28 and a sense circuit 30. The use of ferroelectric capacitors as the basic memory storage element renders the memory unit nonvolatile. The writing of data to memory produces a physical domain polarization within the ferroelectric capacitors. This polarization is not destroyed when the writing voltage is removed.

Figure 2:
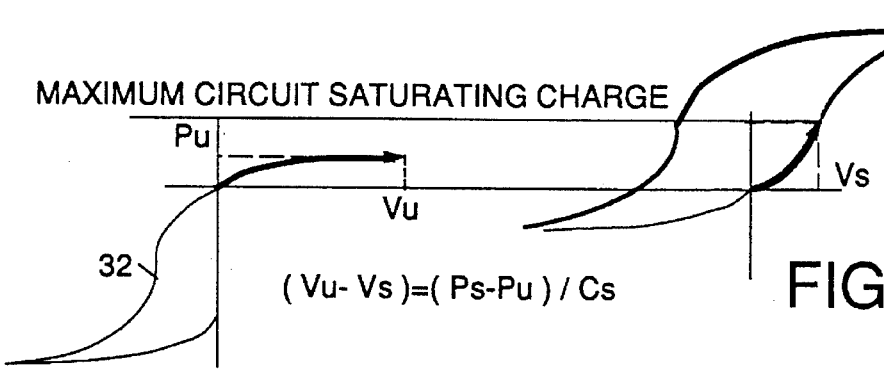
FIG. 2 is a schematic diagram of the two polarization-voltage curves for the ferroelectric capacitors of FIG. 1 in relation to each other, during nondestructive readout.

The principle underlying the preferred embodiment of the present invention is illustrated in FIG. 2. The two ferroelectric capacitors 24 and 26 of the memory cell are represented by their respective polarization-voltage curves 32 and 34. In the operation of the memory unit 20, a single bit of information is stored in the memory cell 22 by the write circuitry 28. Based upon a selected data bit value (i.e., "1" or "0"), the write circuitry 28 applies voltages such that the ferroelectric capacitors 24 and 26 are placed into opposite, fully saturated polarization states. These states are retained after the applied writing voltage is removed.

When the information stored in the memory cell 22 is to be sensed, a sensing voltage is applied to switch a portion of the polarization of one of the ferroelectric capacitors toward the opposite state. In FIG. 2, the hysteresis curve on the left illustrates the polarization-applied field region for the ferroelectric capacitor in the minimum capacitance state, where the voltage across the ferroelectric capacitor reaches a maximum. It is emphasized that, by design, only a partial switching of the polarization state of one of the ferroelectric capacitors is accomplished during the sensing. In the preferred approach, the sensing voltage is selected in relation to the ferroelectric capacitances and other circuit parameters to achieve only the partial switching, not a complete switching, of the polarization state of the oppositely polarized ferroelectric capacitor. This partially switched state is stable in the sense that the physical polarization state of the ferroelectric capacitors is retained even after sensing is complete. Thus, the stored data is preserved within the memory unit and can be read out again without any further actions by way of refreshing the data state. Thus, this approach is termed NonDestructive ReadOut, or NDRO.

Figure 3:
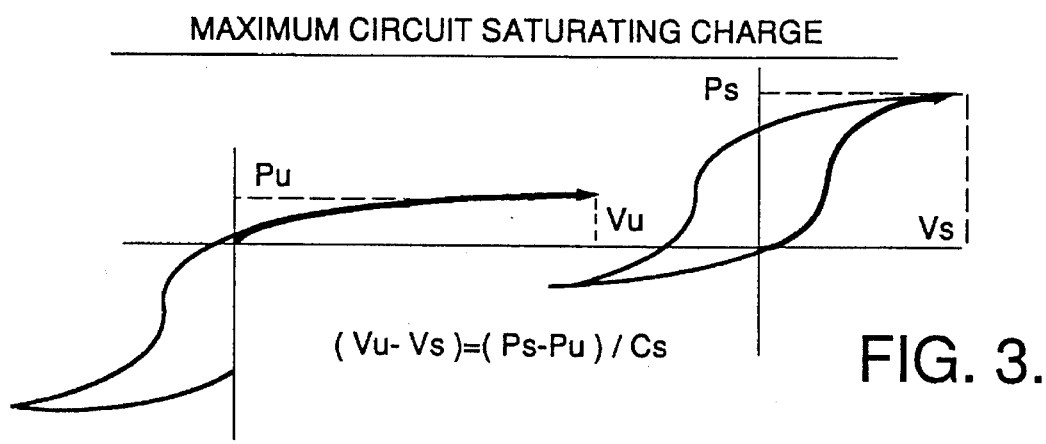
FIG. 3 is a schematic diagram of the two polarization-voltage curves for the ferroelectric capacitors of FIG. 1 in relation to each other, during destructive readout.

FIG. 3 depicts the polarization curves comparable to those of FIG. 2, but for a different readout approach that is not within the scope of the invention, and is distinct from the present approach. This readout approach, termed Destructive ReadOut or DRO, utilizes a complete switching of the polarization state of the oppositely polarized ferroelectric capacitor during sensing. The result of readout is that both ferroelectric capacitors are fully polarized in the same direction. The stored data is not stable in the same sense as for NDRO, because the stored data is not physically embodied in the state of the ferroelectric capacitors immediately upon readout.

For both NDRO and DRO, the conventional practice is to refresh the state of the memory cell after readout by the sense circuitry 30 is complete. That is, the sensed data is effectively communicated to the write circuitry 28 and rewritten back into the memory cell 22 for later recall, a process termed a "refresh", see the schematic refresh circuitry 31 of FIG. 1. In most instances, both NDRO and DRO would therefore give satisfactory results.

However, if an electrically disruptive, transient event occurs before the refresh is complete, the data stored in the DRO system is lost. Because the refreshing is not completed and the original data was obliterated during the sensing process in DRO, there is no way of reconstructing that data unless some other memory scheme is utilized. By contrast, in NDRO the physical state of the ferroelectric capacitors preserves the data during readout because the polarization state is only partly changed. Even if the refresh is not completed, the data is available for sensing in the next readout.

As shown in FIG. 2, the partial switching of the polarization state is accomplished by placing two constraints on the circuit design. First, the voltage across the ferroelectric capacitor when in the nonswitching or minimum capacitance state is just sufficient to saturate the polarization of the capacitor. Second, the circuitry design limits the amount of polarization that can be switched from the ferroelectric capacitor for any given application of the read voltage. This limit must be less than the available polarization. The minimum number of reads that can be interrupted without a refresh is the available maximum polarization divided by this limited switchable polarization. With consecutive interrupted readouts (i.e., readouts where no refresh occurs), the voltage across the switching ferroelectric capacitor increases until, at some point, the switching ferroelectric capacitor becomes a nonswitching ferroelectric capacitor and the stored data can no longer be successfully read.

Since some polarization reversal and charge transfer is required according to this approach, there is a practical limit to the number of readouts using the NDRO approach, without any refreshing. The limit arises due to the sensitivity of the sensing circuitry in detecting the differential polarization. The inventors have constructed prototypes of the present NDRO memory invention having the capability of 10–12 readouts without refresh. Studies have shown that, for most applications, such a capability gives highly satisfactory protection against data loss due to disruptions after sensing but before refreshing.

Figure 4:
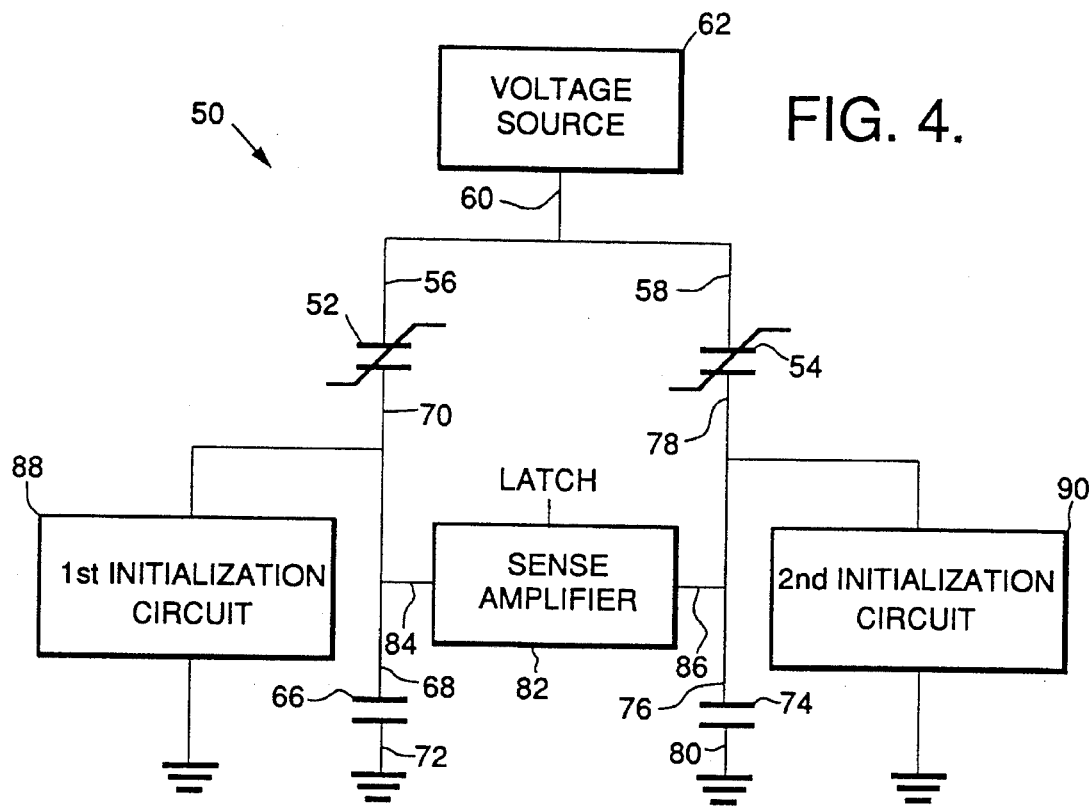
FIG. 4 is a circuit diagram of a first type of memory element utilizing the approach of the invention.

FIG. 4 illustrates a preferred circuit for implementing the NDRO memory unit in a form compatible with the fabrication of large memory arrays by microelectronics fabrication technology although other circuits will, of course, be possible. A memory unit 50 includes a first ferroelectric capacitor 52 and a second ferroelectric capacitor 54. Preferably, the two ferroelectric capacitors are as nearly identical as possible, but differences in properties do not render the memory cell inoperable. The respective inputs 56 and 58 of the ferroelectric capacitors 52 and 54 are connected to a common drive line 60, which in turn communicates with a voltage source 62 of a time-dependent voltage.

A first sense capacitor 66 has a first terminal 68 that is connected to an output 70 of the first ferroelectric capacitor 52. A second terminal 72 of the first sense capacitor is connected to a reference voltage, here selected for convenience as ground but which could be any other stable reference value. Similarly, a second sense capacitor 74 has a first terminal 76 that is connected to an output 78 of the second ferroelectric capacitor 54. A second terminal 80 of the second sense capacitor 74 is connected to a reference voltage, here ground.

A latching sense amplifier 82 has a first input 84 in communication with the first ferroelectric capacitor output 70 and a second input 86 in communication with the second ferroelectric capacitor output 78. The sense amplifier amplifies the magnitude of the difference in the integrated current flowing in the outputs 70 and 78 and senses which of the outputs 70 and 78 has a larger integrated current as an indicator of the identity of the stored data (e.g., "1" or "0"). That information is latched for communication to a data readout and also for the refresh operation.

first initialization circuit 88 communicates with the first input 84 of the latching sense amplifier 82, and a second initialization circuit 90 communicates with the second input 85. The initialization circuits 88 and 90 controllably latch one of two (high or low) reference voltages to the respective sense amplifier inputs 84 and 86. These reference voltages are sufficiently different that the sense amplifier can easily detect and amplify the difference to the rails of the supply on application of the latch circuitry.

Each pair of capacitors (52, 66) or (54, 74) is arranged in a circuit element termed a Sawyer-Tower circuit, as illustrated. In this circuit element to which a voltage $V_a$ is applied across the ferroelectric capacitor (52, 54) of capacitance $C_{fe}$ and the linear sense capacitor (66, 74) of capacitance $C_s$, the voltage $V_{fe}$ across the ferroelectric capacitor is $$V_{fe}=C_s(V_a/(C_s+C_{fe})$$

The capacitance of the ferroelectric capacitor is associated with its ferroelectric polarization state, and therefore the voltage across the two ferroelectric capacitors is different for the two Sawyer-Tower circuit elements used in the memory cell of FIG. 4. The maximum voltage across the ferroelectric capacitor occurs when $C_{fe}$ is a minimum, and tile minimum voltage across the ferroelectric capacitor occurs when $C_{fe}$ is a maximum. For all NDRO reads of the two ferroelectric capacitors, one will have the maximum voltage across it while the other will have a lower voltage across it due to the fact that some polarization was switched from it during the application of the read voltage $V_a$.

The maximum polarization that can be switched from the ferroelectric capacitor is obtained by assuming that the capacitance of the ferroelectric capacitor is very much greater than that of the sense capacitor $C_s$. The amount of polarization is the product of $C_s$ and $V_a$.

The voltage sensed by the sense amplifier is the difference between the applied voltage and the voltage across the ferroelectric capacitor.

In a preferred design, $C_s$ is chosen so that, when the ferroelectric polarization of the ferroelectric capacitor is saturated down such that no polarization is switched upon application of the drive line voltage $V_a$, $$V_a-V_{sa}=3V_{fe}$$

where $V_{sa}$ is the voltage at the sense amplifier and $V_{fe}$ is the voltage across the ferroelectric capacitor. In one working embodiment of the memory unit of FIG. 4, $V_a$ was 5 volts. $C_s$ was chosen so that $V_a-V_{sa}$ was 1.5 volts; $C_s$ was therefore 0.65 pf (picofarads). With this selection of parameters, $C_{fe}$ varied from 1.25 pf to 13 pf depending upon the polarization state and the applied voltage.

(This selection of parameters is to be contrasted with the parameters that would be selected for a DRO memory using a Sawyer-Tower circuit element. In that case, the capacitance of the sense capacitor is selected to be much larger than the capacitance of the ferroelectric capacitor, so that the voltage in all cases across the ferroelectric capacitor is about equal to the applied voltage. Thus, for example, if the capacitance of the sense capacitor is selected to be about 3 pf, the saturated capacitance of the ferroelectric capacitor is about 0.6 pf.)

Returning to the memory unit 50 of FIG. 4, to write data to the memory unit the latch on the sense amplifier is disabled and the initialization circuits 88 and 90 provide the appropriate reference levels for the desired data. Thus, before writing (or reading) data, the inputs to the sense amplifier are connected to a known voltage, a step termed precharging. For example, the reference voltage of circuit 88 might be high and the reference voltage of circuit 90 low for a data "1", and the reference voltage of circuit 88 might be low and the reference voltage of circuit 90 high for a data "0". The input state is latched into the sense amplifier without any voltage applied to the drive line 60 writing the polarization of the capacitor on the high side of the sense amplifier to the desired state. To write the capacitor on the low side of the sense amplifier a pulse is applied to the drive line 60 from the voltage source 62. After the drive line pulse voltage is removed the latch of the sensing amplifier 82 is released. This completes the data write operation.

To read data from the memory unit 50 and refresh the memory unit 50, the initialization circuits 88 and 90 are used to reference the inputs of the sense amplifier identically and then disabled, precharging the circuit. A voltage pulse is applied from the voltage source 62 to the drive line 60 to effect a partial switch of the ferroelectric polarization of only the one of the two ferroelectric capacitors 52 or 54 that is oppositely polarized to the voltage pulse. Before the drive line pulse is removed, the sense amplifier 82 is latched, and the state of the latch, reflecting the "1" or "0" nature of the stored data, is communicated to the external circuitry that requested the reading of data. When the drive line pulse is removed the latched sense amplifier output restores the polarization into the partially depolarized capacitor which accomplishes the refresh. The latch of the sense amplifier 82 is released, completing the read and refresh. In the event that the read is interrupted during the application of the drive line pulse, the data in the memory unit 50 is not lost. The data may be later recalled at least several times prior to any refreshing of the memory.

In this preferred approach, the properties of the ferroelectric capacitors 52 and 54, the properties of the sense capacitors 66 and 74, and the drive line voltage from the voltage source 62 are selected to meet particular criteria so that only a partial switching of charge occurs with each application of the drive line voltage during sensing. The capacitances of the first sense capacitor 66 and the second sense capacitor 74 are the same value $C_s$. The product of the drive line voltage applied from the voltage source 62 and $C_s$ is less than half the switchable ferroelectric polarization of each of the ferroelectric capacitors 52 or 54. The maximum voltage across each of the ferroelectric capacitors 52 or 54 when the ferroelectric capacitors are about in their minimum capacitance state (i.e., minimum capacitance or nearly the minimum capacitance state) is selected to just saturate their polarization. In the case of the preferred Y1 material used in the fabrication of the ferroelectric capacitors, which material will be discussed subsequently, the maximum voltage is from about 2½ to 9½, most preferably 3, times the coercive voltage of the ferroelectric capacitor. The maximum voltage $V_{max}$ is defined in terms of the minimum capacitance of the ferroelectric capacitor, $C_{fem}$, referenced earlier. It can be calculated as $$V_{max} = C_s(V_a/(C_s + C_{fem})$$

$C_b$ is the capacitance of the reference capacitor and $V_a$ is the applied voltage.

The just-completed description relates to a single memory cell for storing a single bit of data. The memory cell circuitry involving the ferroelectric capacitors 52 and 54, and the sense capacitors 66 and 74, can be repeated as many times as necessary to effect multiple memory cells for storing multiple data bits. The voltage source 62, sense amplifier 82, and initialization circuits 88 and 90 are common to the multiple memory cells and connected as needed. In such a memory cell array, individual cells are addressed using conventional addressing techniques.

Figure 5:
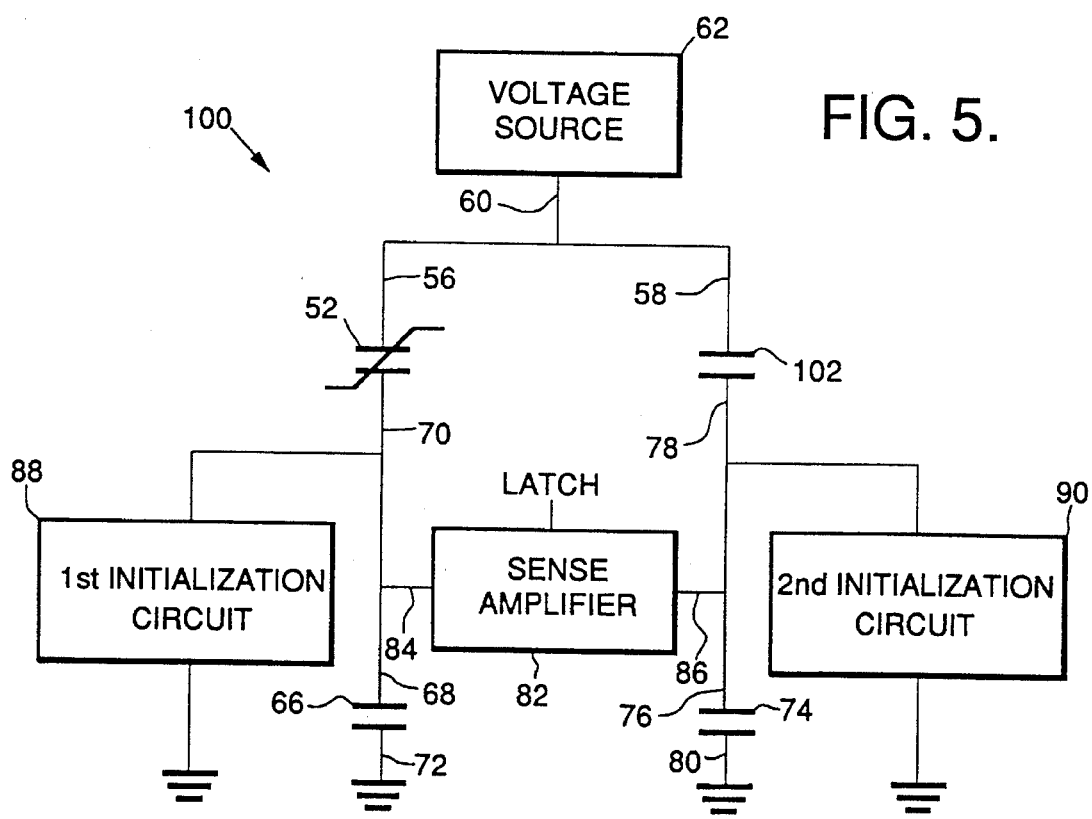
FIG. 5 is a circuit diagram of a second type of memory element utilizing the approach of the invention.

FIG. 5 depicts a variation of the present approach. A memory unit 100 is identical to the memory unit 50, except that the second ferroelectric capacitor 54 is replaced by a standard linear capacitor 102 used as a reference. That is, only one of the capacitors need be a ferroelectric capacitor.

As with the embodiment of FIG. 4, the operating parameters of the circuit and the component values are carefully selected to ensure only a partial switching of the charge during sensing. The maximum voltage across the ferroelectric capacitor 52 when the ferroelectric capacitor is at about its minimum capacitance state (i.e., minimum capacitance or nearly the minimum capacitance state) is selected to just saturate its polarization. In the case of the preferred Y1 material used in the fabrication of the ferroelectric capacitor, the maximum voltage is from about 2½ to 2½, most preferably 3, times the coercive voltage of the ferroelectric capacitor. The capacitance of the reference capacitor 102 is greater than the minimum capacitance of the ferroelectric capacitor 52, but less than the effective ferroelectric capacitance associated with the second application of the applied voltage from the source 62 to the ferroelectric capacitor with a saturated polarization opposite to the field generated by the drive line voltage. This approach reduces the number of interrupts possible before the data is lost. The capacitance of the reference capacitor can be adjusted to provide the optimum performance. An alternative circuit would provide a stable voltage reference in place of the capacitance voltage divider. For example, the stable, controllable reference voltage could be applied from the second initialization circuit.

The ferroelectric capacitors 52 and 54 may be made with any ferroelectric material. The preferred ferroelectric material is a known layered superlattice ferroelectric material that is available commercially from Symetrix Corporation and is described, for example, in PCT publications WO93/12542, WO93/12588, and WO98/10627, whose disclosures are incorporated by reference. Y1 generally has a composition of

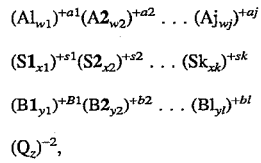

where A1, A2, ... Aj are A-site elements in a perovskite-like structure; S1, S2, ... Sk are superlattice generator elements; B1, B2, and Bl are B-site elements in a perovskite-like structure; Q is an anion; the superscripts indicate valences of the respective elements; the subscripts indicate the average number of atoms of the element in the unit cell of the perovskite-like structure, and at least w1 and y1 are non-zero. Examples of A-site elements include strontium, calcium, barium, bismuth, cadmium, and lead; examples of B-site elements include titanium, tantalum, hafnium, tungsten, niobium, and zirconium; examples of superlattice generator elements include bismuth, scandium, yttrium, lanthanum, antimony, chromium, and thallium; examples of anions include oxygen, chlorine, and fluorine.

The layered superlattice ferroelectric materials such as Y1 are highly resistant to fatigue of the polarization properties. Many other ferroelectric materials exhibit a degradation in their polarization properties after numerous state switches of the type required in a ferroelectric memory device. Materials such as Y1 are not subject to much, if any, fatigue-based degradation.

Other known ferroelectric materials are also operable in the invention. Examples include $KNO_3$ (potassium nitrate), $PbLa_2$—$ZrO_2$—$TiO_2$ (PLZT), $PbTiO_3$—$PbZrO_3$ (lead zirconate titanate or PZT), and $PbTiO_3$ (lead titanate).

A prototype NDRO 255-bit random access memory utilizing the approach described above has been constructed and successfully operated. The ferroelectric capacitors were 15×15 micrometers in size and made of the Y1 material. Fatigue-free, nonvolatile operation was demonstrated for over $10^{12}$ write/read cycles. In a series of tests of the memory, transient interrupts were introduced at various points during the sensing/readout period. The prototype operated successfully without refresh for three interrupts or more in all cases.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A memory, comprising:

a ferroelectric capacitor having a minimum ferroelectric capacitance;

a reference capacitor in parallel arrangement with the ferroelectric capacitor, the reference capacitor having a capacitance greater than the minimum ferroelectric capacitance of the ferroelectric capacitor;

means for writing controllably different saturation polarization states into the ferroelectric capacitor using a single input signal;

means for sensing the difference in capacitance of the ferroelectric capacitor and the reference capacitor, the means for sensing causing only a partial switching in the polarization state of the ferroelectric capacitor when the ferroelectric capacitor is in a state of capacitance greater than the reference capacitor and no change in the polarization state of the ferroelectric capacitor when the ferroelectric capacitor is in a minimum capacitance state, the means for sensing leaving the capacitance of the ferroelectric capacitor greater than that of the reference capacitor; and means to restore the original ferroelectric polarization of the ferroelectric capacitor following operation of the means for sensing.

2. A memory comprising at least one memory element, each memory element including a first ferroelectric capacitor having a first ferroelectric capacitor input and a first ferroelectric capacitor output, the first ferroelectric capacitor having a first ferroelectric capacitor capacitance;

a second ferroelectric capacitor having a second ferroelectric capacitor input and a second ferroelectric capacitor output, the second ferroelectric capacitor having a second ferroelectric capacitor capacitance;

a drive line communicating with the first ferroelectric capacitor input and the second ferroelectric capacitor input;

a source of a time-dependent applied drive line voltage communicating with the drive line, the source of a time-dependent applied drive line voltage having a voltage output sufficient to saturate the first ferroelectric capacitor and the second ferroelectric capacitor when the first ferroelectric capacitor output is at a reference potential and the second ferroelectric capacitor output is at a reference potential;

a first sense capacitor having a first sense capacitor terminal communicating with the first ferroelectric capacitor output and a referenced first sense capacitor second terminal, the first sense capacitor having a first sense capacitor capacitance;

a second sense capacitor having a second sense capacitor terminal communicating with the second ferroelectric capacitor output and a referenced second sense capacitor second terminal, the second sense capacitor having a second sense capacitor capacitance;

a sense amplifier having
  a first sense amplifier input communicating with the first ferroelectric capacitor output and a second sense amplifier input communicating with the second ferroelectric capacitor output,
  means for latching the state of the sense amplifier, and
  means for controllably initializing a latched state to the sense amplifier, the latched sense amplifier high output being sufficient to saturate the first ferroelectric capacitor connected between the first sense amplifier input and the drive line at zero potential and also sufficient to saturate the second ferroelectric capacitor connected between the second sense amplifier input and the drive line at zero potential; and precharge circuit means for controllably referencing the first sense amplifier input and the second sense amplifier input, and wherein the first ferroelectric capacitor capacitance, the second ferroelectric capacitor capacitance, the first sense capacitor capacitance, the second sense capacitor capacitance, and the drive line voltage are selected to limit the amount of switched charge upon application of the source of a time-dependent applied drive line voltage such that the product of the drive line voltage and the first sense capacitor capacitance is less than one-half of the switchable ferroelectric polarization of the first ferroelectric capacitor, the product of, the drive line voltage and the second sense capacitor capacitance is less than one-half of the switchable ferroelectric polarization of the second ferroelectric capacitor, the maximum voltage across the first ferroelectric capacitor in about its minimum capacitance state Just saturates its polarization, and the maximum voltage across the second ferroelectric capacitor in about its minimum capacitance state just saturates its polarization.

3. The memory of claim 2, wherein the first ferroelectric capacitor and the second ferroelectric capacitor each have a dielectric element made of layered superlattice ferroelectric material.

4. The memory of claim 3, wherein the maximum voltage across the first ferroelectric capacitor is from about 2½ to 9½ times the coercive voltage off the ferroelectric capacitor, and wherein the maximum voltage across the second ferroelectric capacitor is from about 2½ to 3½ times the coercive voltage of the ferroelectric capacitor.

5. A memory comprising at least one memory element, each memory element including a ferroelectric capacitor having a ferroelectric capacitor input and a ferroelectric capacitor output, the ferroelectric capacitor having a ferroelectric capacitor capacitance;

a reference capacitor having a reference capacitor input and a reference capacitor output, the reference capacitor having a reference capacitor capacitance;

a drive line communicating with the ferroelectric capacitor input and the reference capacitor input;

a source of a time-dependent applied drive line voltage communicating with the drive line, the source of a time-dependent applied drive line voltage having a voltage output sufficient to saturate the ferroelectric capacitor and the reference capacitor when the ferroelectric capacitor output is at a reference potential and the reference capacitor output is at a reference potential;

a first sense capacitor having a first sense capacitor terminal communicating with the ferroelectric capacitor output and a referenced first sense capacitor second terminal, the first sense capacitor having a first sense capacitor capacitance;

a second sense capacitor having a second sense capacitor terminal communicating with the reference capacitor output and a referenced second sense capacitor second terminal, the second sense capacitor having a second sense capacitor capacitance;

a sense amplifier having
  a first sense amplifier input communicating with the ferroelectric capacitor output and a second sense amplifier input communicating with the reference capacitor output,
  means for latching the state of the sense amplifier, and
  means for controllably initializing a latched state to the sense amplifier, the latched sense amplifier high output being sufficient to saturate the ferroelectric capacitor connected between the first sense amplifier input and the drive line at zero potential and also sufficient to saturate the reference capacitor connected between the second sense amplifier input and the drive line at zero potential; and precharge circuit means for controllably referencing the first sense amplifier input and the second sense amplifier input, and wherein the ferroelectric capacitor capacitance, the first sense capacitor capacitance, the second sense capacitor capacitance, and the drive line voltage are selected to limit the amount of switched charge upon application of the source of a time-dependent applied drive line voltage such that the product of the drive line voltage and the first sense capacitor capacitance is less than one-half of the switchable ferroelectric polarization of the ferroelectric capacitor, the product of the drive line voltage and the second sense capacitor capacitance is less than one-half of the switchable ferroelectric polarization of the reference capacitor, the maximum voltage across the ferroelectric capacitor in about its minimum capacitance state just saturates its polarization, the maximum voltage across the reference capacitor in about its minimum capacitance state just saturates its polarization, and the reference capacitor capacitance is greater than the minimum capacitance of the ferroelectric capacitor, but less than the capacitance of the ferroelectric capacitor following the nth drive line pulse when the ferroelectric capacitor has a saturated polarization opposite to the field generated by the drive line voltage.

6. The memory of claim 5, wherein the ferroelectric capacitor has a dielectric element made of layered superlattice ferroelectric material.

7. The memory of claim 7, wherein the maximum voltage across the first ferroelectric capacitor is from about 2½ to 9½ times the coercive voltage of the ferroelectric capacitor, and wherein the maximum voltage across the second ferroelectric capacitor is from about 2½ to 2½ times the coercive voltage of the ferroelectric capacitor.

8. The memory of claim 5, wherein the maximum voltage across the ferroelectric capacitor in about its minimum capacitance state is less than a voltage that saturates its polarization.

* * * * *

UNITED STATES PATENT AND TRADEMARK OFFICE
CERTIFICATE OF CORRECTION

PATENT NO.    : 5,487,030
DATED         : January 23, 1996
INVENTOR(S)   : John J. Drab and O. Glenn Ramer It is certified that error appears in the above-identified patent and that said Letters Patent is hereby corrected as shown below:

Column 1,
Line 3, insert the following:

-- This invention was made with Government support under Contract No. N00030-93-C-0002 awarded by the Department of the Navy. The Government has certain rights in this invention. --

Signed and Sealed this

Eighteenth Day of June, 2002

*Attest:*

*Attesting Officer*

JAMES E. ROGAN
*Director of the United States Patent and Trademark Office*